United States Patent
Dadvand et al.

(10) Patent No.: US 11,443,996 B2
(45) Date of Patent: Sep. 13, 2022

(54) ZINC LAYER FOR A SEMICONDUCTOR DIE PILLAR

(71) Applicant: TEXAS INSTRUMENTS INCORPORATED, Dallas, TX (US)

(72) Inventors: Nazila Dadvand, Richardson, TX (US); Keith Edward Johnson, Garland, TX (US); Christopher Daniel Manack, Flower Mound, TX (US); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 371 days.

(21) Appl. No.: 15/909,679

(22) Filed: Mar. 1, 2018

(65) Prior Publication Data
US 2019/0109062 A1 Apr. 11, 2019

Related U.S. Application Data

(60) Provisional application No. 62/568,484, filed on Oct. 5, 2017.

(51) Int. Cl.
| | |
|---|---|
| H01L 23/31 | (2006.01) |
| H01L 23/498 | (2006.01) |
| H01L 23/538 | (2006.01) |
| H01L 25/065 | (2006.01) |
| H01L 23/00 | (2006.01) |
| H01L 21/56 | (2006.01) |

(52) U.S. Cl.
CPC ........ *H01L 23/3128* (2013.01); *H01L 21/561* (2013.01); *H01L 23/3114* (2013.01); *H01L 23/49811* (2013.01); *H01L 23/5384* (2013.01); *H01L 23/5389* (2013.01); *H01L 24/11* (2013.01); *H01L 24/13* (2013.01); *H01L 24/17* (2013.01); *H01L 24/19* (2013.01); *H01L 24/82* (2013.01); *H01L 25/0657* (2013.01); *H01L 2224/94* (2013.01); *H01L 2924/15313* (2013.01)

(58) Field of Classification Search
CPC ............. H01L 23/3128; H01L 23/3114; H01L 23/49811
See application file for complete search history.

(56) References Cited

U.S. PATENT DOCUMENTS

| | | | |
|---|---|---|---|
| 2009/0197114 A1* | 8/2009 | Shih ....................... | B23K 1/203 228/256 |
| 2011/0037171 A1* | 2/2011 | Rinne .................... | H05K 3/243 257/737 |
| 2018/0047688 A1* | 2/2018 | Ho .................... | H01L 23/49827 |

* cited by examiner

*Primary Examiner* — Wael M Fahmy
*Assistant Examiner* — Quinton A Brasfield
(74) *Attorney, Agent, or Firm* — Dawn Jos; Charles A. Brill; Frank D. Cimino

(57) ABSTRACT

A method for fabricating a copper pillar. The method includes forming a layer of titanium tungsten (TiW) over a semiconductor wafer, forming a layer of zinc (Zn) over the layer of TiW, and forming a copper pillar over the via. In addition, the method includes performing an anneal to diffuse the layer of Zn into the copper pillar. A semiconductor device that includes a layer of TiW coupled to a via of a semiconductor wafer and a copper pillar coupled to the layer of TiW. The copper pillar has interdiffused Zn within its bottom portion. Another method for fabricating a copper pillar includes forming a layer of TiW over a semiconductor wafer, forming a first patterned photoresist, forming a layer of Zn, and then removing the first patterned photoresist. The method further includes forming a second patterned photoresist and forming a copper pillar.

14 Claims, 8 Drawing Sheets

ZINC LAYER FOR A SEMICONDUCTOR DIE PILLAR

CLAIM TO PRIORITY OF NONPROVISIONAL APPLICATION

This application claims the benefit under 35 U.S.C. 119(e) of U.S. Provisional Application No. 62/568,484, filed Oct. 5, 2017, the content of which is incorporated by reference.

BACKGROUND OF THE INVENTION

This invention relates to the fabrication of a pillar over a via of a semiconductor die.

DETAILED DESCRIPTION OF THE INVENTION

Figure 1:
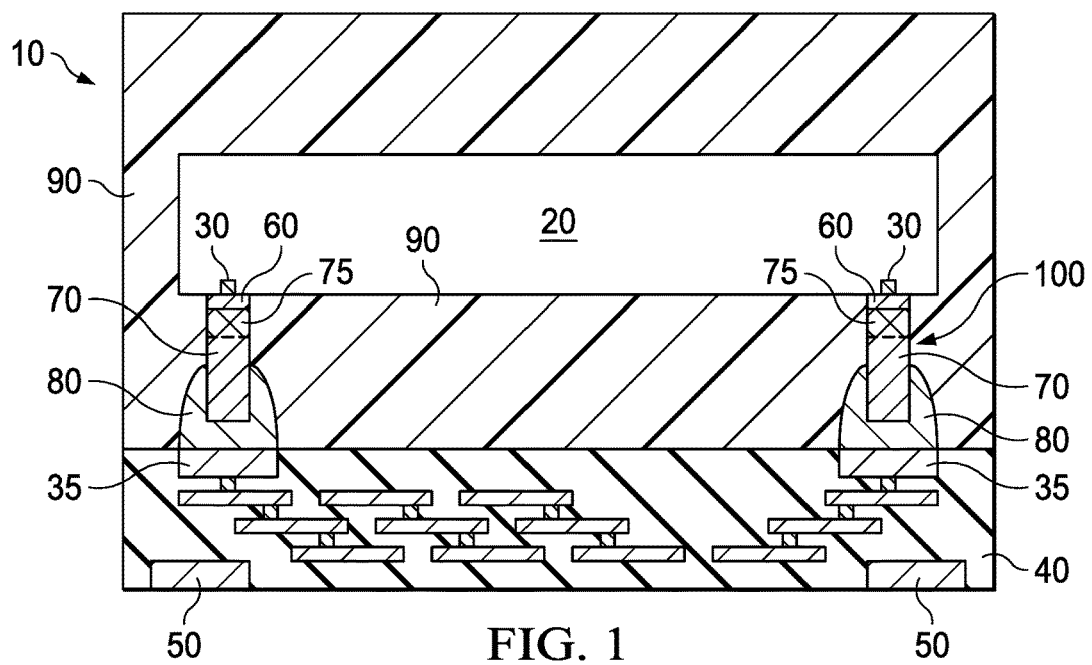
FIG. 1 is a cross-sectional view of a packaged semiconductor device in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a packaged semiconductor device 10 in accordance with an example embodiment. In this example, the packaged semiconductor device 10 contains a semiconductor die 20 that has copper vias 30 connected to electrical circuitry (not shown) within the semiconductor die 20. The copper vias 30 may be formed with a conventional process, such as etching via holes into the surface of the semiconductor die 20, coating the surface of the semiconductor die 20 with titanium tungsten (TiW), coating the TiW surface with copper, using an electroplating process to fill the via holes with copper, and then polishing the TiW and Cu off the surface of the semiconductor die 20. Alternatively, the vias may be formed by depositing tungsten (W) instead of Cu into the via holes (over the coating of TiW).

The semiconductor die 20 is electrically and physically attached to a multi-layered solder resist printed circuit board (PCB) 40. The PCB 40 contains multiple layers of electrical traces that properly direct electrical signals within the PCB. In addition, the PCB 40 contains leads 50 that electrically connect the PCB 40 and the semiconductor die 20 to other electrical devices (not shown) within an electrical system. The semiconductor die 20 is attached to pads 35 of the PCB through a layer of TiW 60, a copper pillar 70, and solder resist 80. Molding compound 90 encapsulates the semiconductor die 20 and portions of the PCB 40. Note that the surface of leads 50 is often left unencapsulated to facilitate their electrical interconnection to other electrical devices.

In accordance with the example embodiment, the copper pillar 70 has a bottom portion 75 that includes interdiffused zinc (the top portion is pure copper). Therefore, the bottom portion 75 of the copper pillar 70 may contain brass (as explained more fully below).

As shown in FIG. 1, it is within the scope of the invention to create a layer of TiW and a copper pillar 70/75 that has a perimeter 100 that extends beyond the location of vias 30. This extended perimeter of elements 60, 70/75 may increase the likelihood that the entire surface of each via 30 is in electrical contact with elements 60, 70/75 (which may improve the reliability of the packaged semiconductor device 10).

Figures 2, 13:
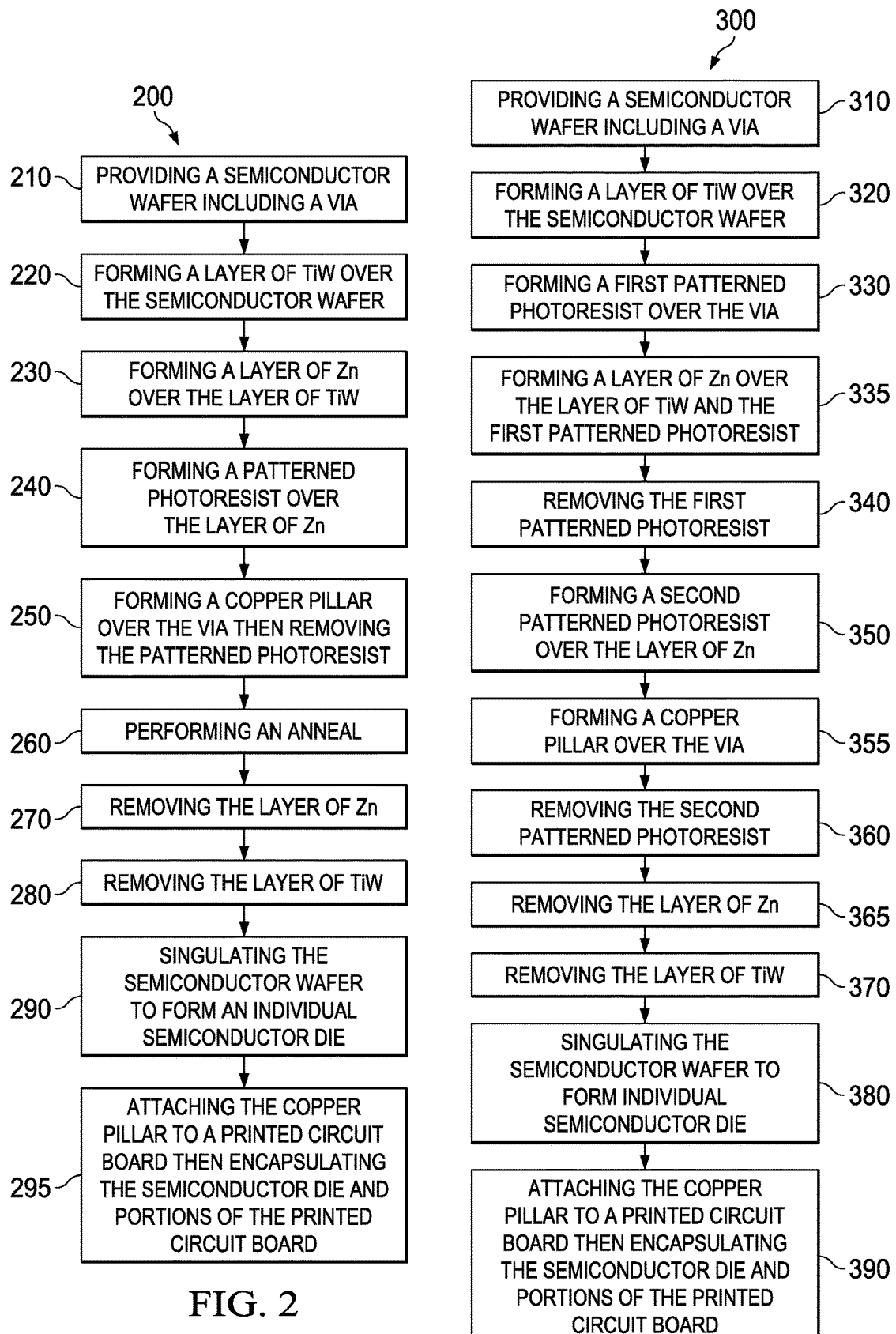
FIG. 2 is a method for fabricating the packaged semiconductor device of FIG. 1.
FIG. 13 is a method for fabricating the alternative packaged semiconductor device of FIG. 12.

FIG. 2 shows an example method 200 for fabricating the packaged semiconductor device 10 of FIG. 1. FIGS. 3-11 illustrate selected steps of method 200. The example method 200 is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

Figure 3:
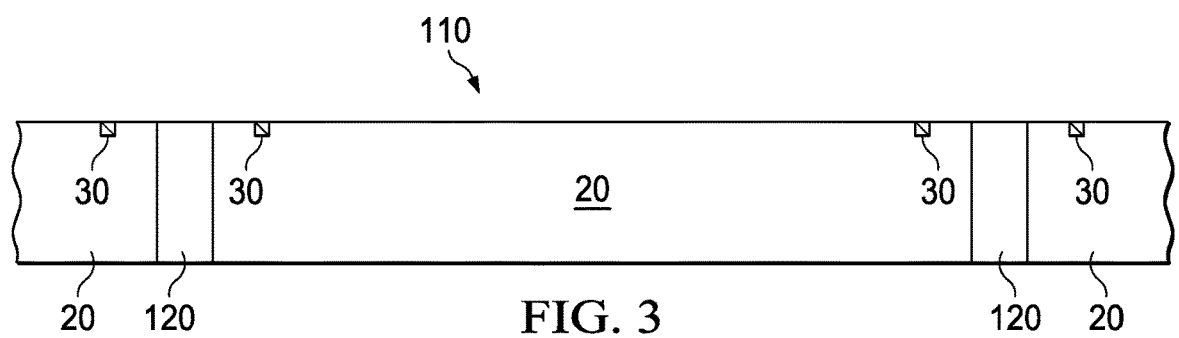
FIGS. 3-11 are cross-sectional diagrams of selected steps of the method of FIG. 2.

Step 210 is the provision of a fully processed semiconductor wafer 110, as shown in FIG. 3. The semiconductor wafer 110 contains numerous completed semiconductor dies 20. The semiconductor dies 20 may contain any combination of active and passive electrical circuitry, such as CMOS, BiCMOS and bipolar junction transistors—as well as capacitors, optoelectronic devices, inductors, resistors, and diodes. In addition, the semiconductor dies 20 include vias 30 that are connected to the electrical circuitry (not shown) within the semiconductor die 20. In method 200 the vias include copper; however, the vias may contain other suitable materials such as tungsten.

The semiconductor dies 20 are spaced apart from each other on the semiconductor wafer 110 by zones 120 of unprocessed semiconductor material. These zones 120 of unprocessed semiconductor material are mostly destroyed by a rotating saw blade during the singulation process (as explained below). Therefore, the zones 120 of unprocessed semiconductor material are often called "saw streets" because they form a grid between all of the semiconductor dies 20 on the semiconductor wafer 110 that is largely destroyed by the saw during the dicing process.

Figure 4:
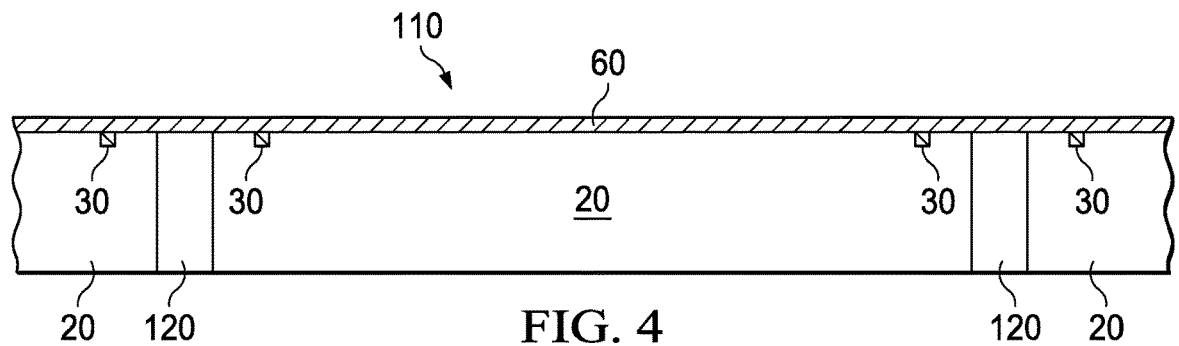

The next step in the fabrication process is the formation of a layer of TiW 60 over the semiconductor wafer 110. As shown in FIG. 4, a layer of TiW is coated over the semiconductor wafer in step 220. In the example method 200, the layer of TiW 60 is formed by sputtering; however, any acceptable method of deposition may be used. The thickness of the layer of TiW 60 may range from 100-400 nm. It is within the scope of the invention to use other acceptable materials that are a diffusion barrier and adhesion promoter. For example, a layer of Ti or TaN may be used instead of TiW 60.

Figure 5:
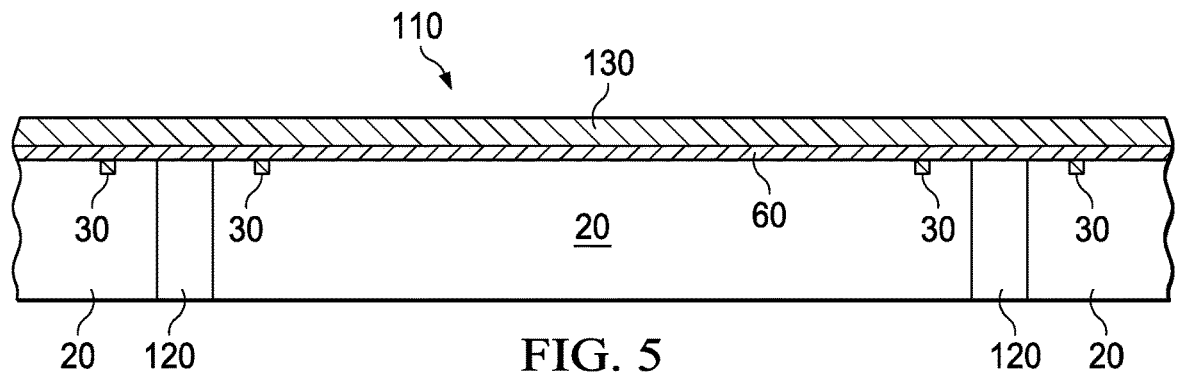

In accordance with the example method 200, step 230 is the formation of a layer of Zn 130 over the layer of TiW 60. Step 230 is shown in FIG. 5. The thickness of the layer of Zn 130 may range from 100 nm-20 μm. Zn 130 is sputtered over the layer of TiW 60 in step 230; however, another acceptable coating method may be used (such as electroplating).

Figure 6:
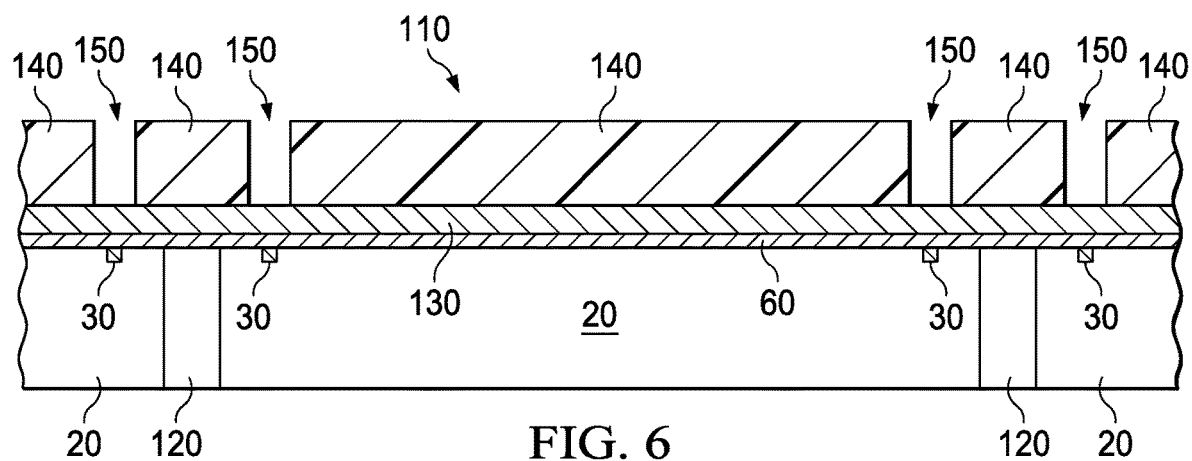

Next, a patterned photoresist 140 is formed in step 240. As shown in FIG. 6, the patterned photoresist 140 has openings 150 over the vias 30. These openings 150 will be used to create the copper pillars 70 in the next step of the fabrication process. In the example method 200, the openings 150 are large enough to create copper pillars 70 with a perimeter 100 that exceeds the width of vias 30. As stated previously, copper pillars 70 having a perimeter 100 that exceeds the width of vias 30 may improve the reliability of the packaged semiconductor device 10.

Figure 7:
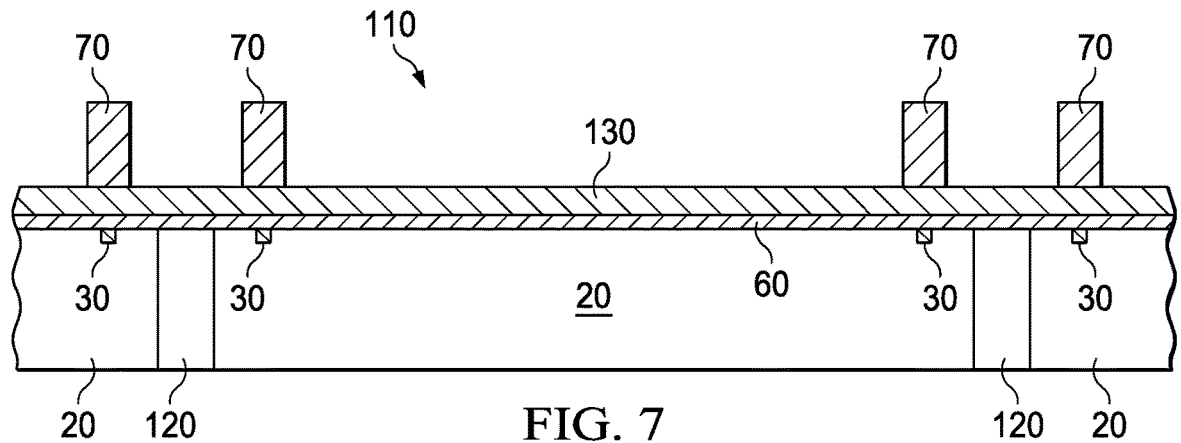

Step 250 is the formation of copper pillars 70. As shown in FIG. 7, the copper pillars 70 are formed over vias 30. More specifically, the copper pillars 70 are formed on the exposed layers of Zn 130 by a standard electroplating process and then the patterned photoresist 140 is removed (using solvent or a plasma etch).

Figure 8:
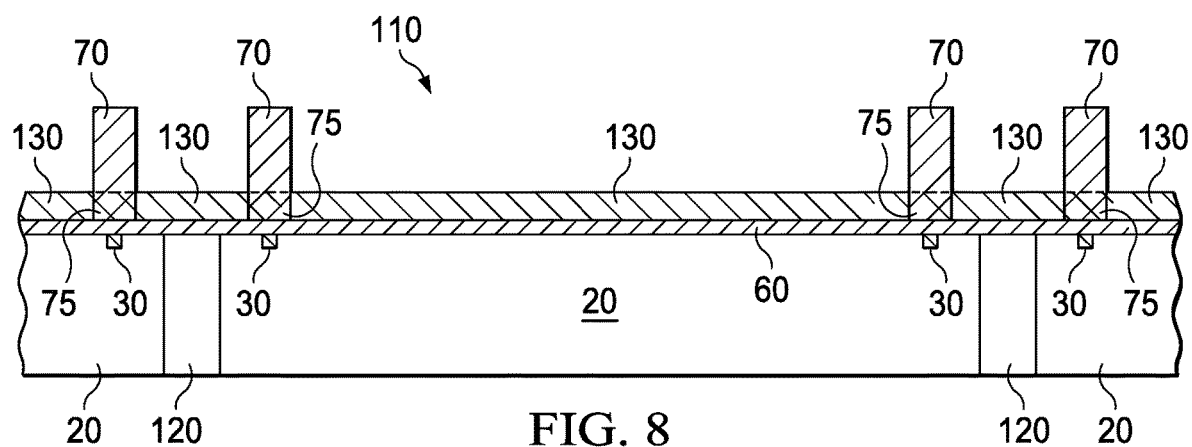

Method 200 continues with an anneal of the semiconductor wafer 110. In step 260, the annealing process will cause the layer of Zn 130 to interdiffuse with the adjoining copper pillar 70. The diffusion process is likely to result in the formation of brass (Cu-20 wt % Zn) in the majority of the bottom portion 75 of the copper pillar 70, as illustrated in FIG. 8. (The top portion of copper pillar 70 will remain pure copper.)

Figure 9:
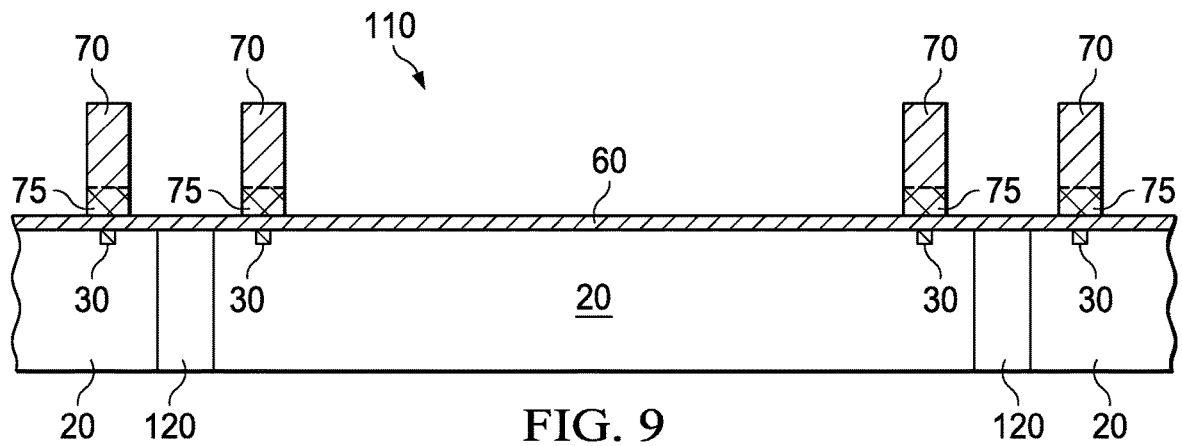
Figure 10:
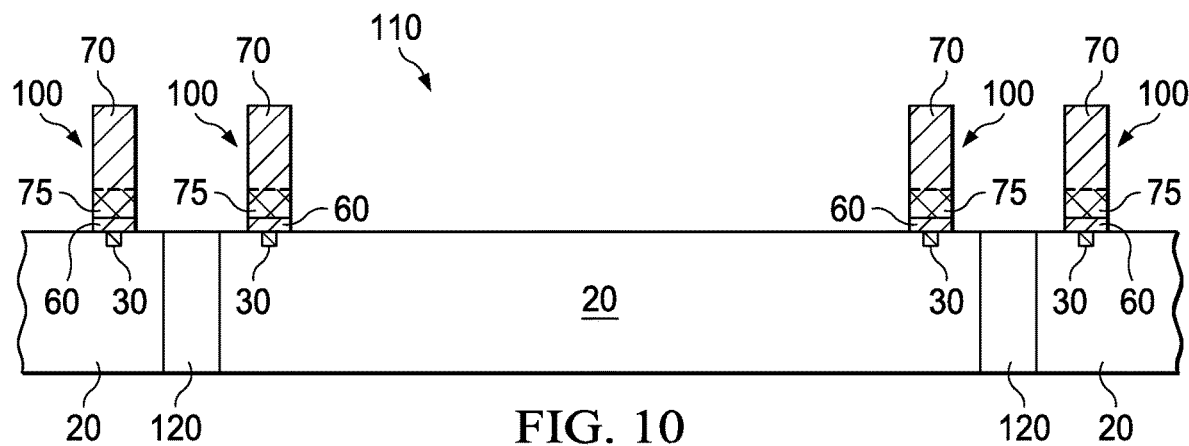

In step 270 the remaining layer of zinc 130 is removed, as shown in FIG. 9. The remaining layer of Zn 130 may be removed by any acceptable process such as a wet etch using diluted hydrochloric acid. As shown in FIG. 10, the layer 60 of TiW located outside the perimeter 100 of the copper pillars 70 is also removed by any acceptable process such as a wet etch using hydrogen peroxide. It is to be noted that there will be minimal undercutting below the outer corners of portion 76 of the copper pillar 70 during the wet etch of the layer of Zn 130. However, there may be a slight amount of undercutting (less than 3%) under the copper pillar 70/75 during the wet etch of the layer of TiW 60.

Figure 11:
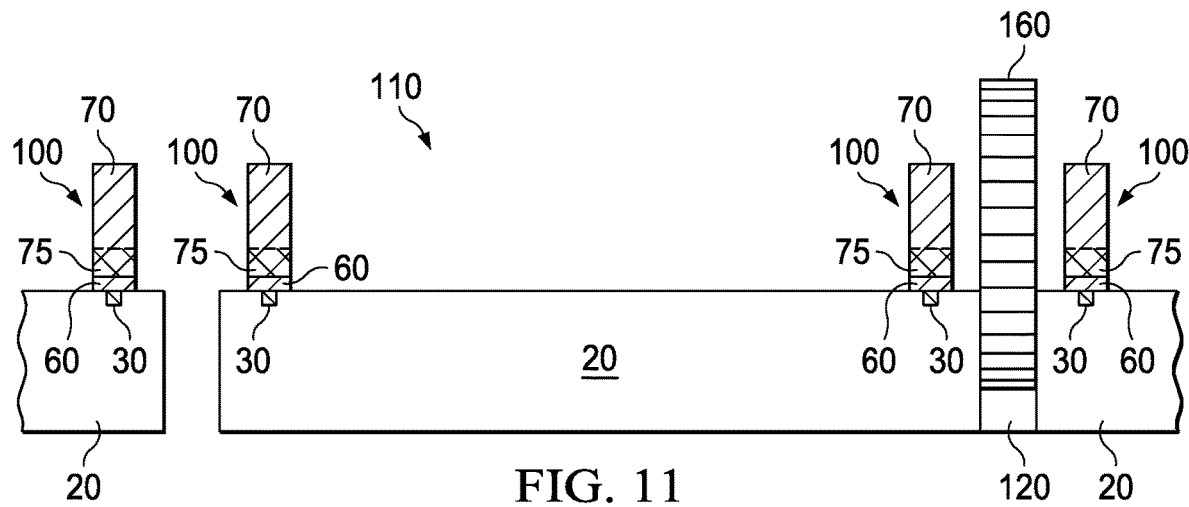

The semiconductor wafer 110 is singulated in step 290, as shown in FIG. 11. A rotating saw blade 160 is typically used to cut through the saw street zones 120 during the dicing process. This singulation process creates individual semiconductor dies 20 that can be further fabricated into a packaged semiconductor die 10 using conventional manufacturing steps. For example, the individual semiconductor dies 20 may be connected to the PCB 40 using any acceptable conventional manufacturing process. In the example step 295, solder resist 80 (such as SnAg) is placed on the exposed top portion of the copper pillar 70 and then a robotic pick-and-place machine may be used to attach the copper pillars 70 to the pads 35 of the PCB 40. Later, the semiconductor die 20 and portions of the PCB 40 are encapsulated with molding compound to create the packaged semiconductor device 10 shown in FIG. 1.

The formation of brass at the interface 75 between the copper pillar 70 and the layer of TiW 60 (that is located above the vias 30) may provide desired corrosion resistance for the copper pillar 70. In addition, the presence of brass at the interface 75 between the copper pillar 70 and the layer of TiW 60 may provide electromigration improvements; thereby increasing the electrical reliability of the packaged semiconductor device 10.

Figure 12:
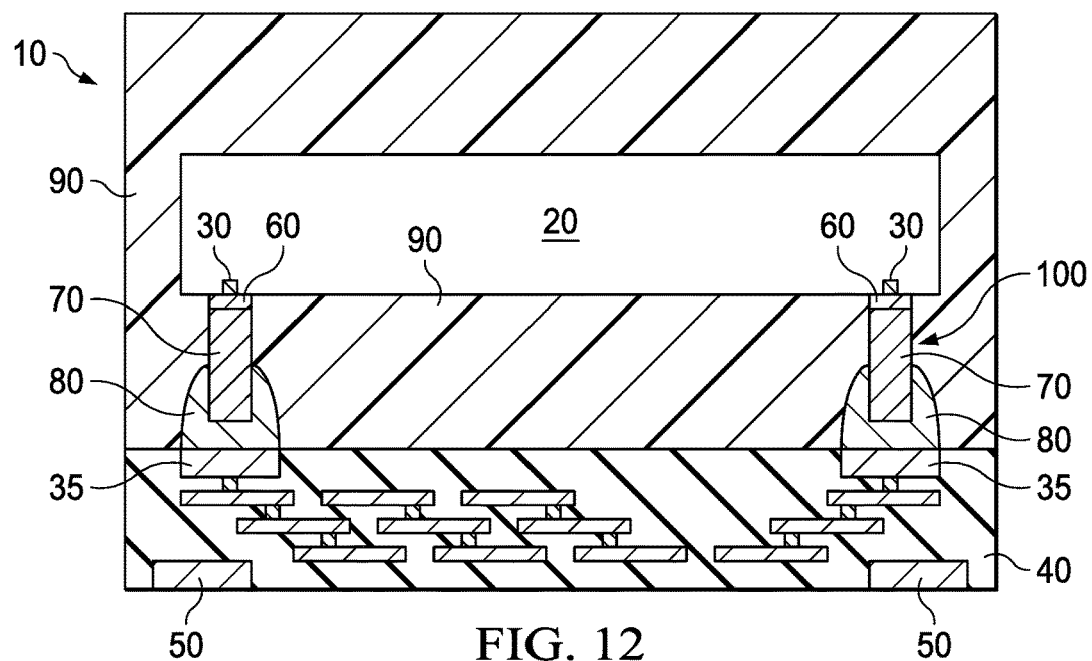
FIG. 12 is a cross-sectional view of an alternative packaged semiconductor device in accordance with the present invention.

Referring again to the drawings, FIG. 12 is a cross-sectional view of a packaged semiconductor device 10 in accordance with an alternative embodiment. As noted above, like reference numerals are used throughout the figures to designate similar or equivalent elements. As with the embodiment shown in FIG. 1, the semiconductor die 20 has copper vias 30 that are connected to electrical circuitry (not shown) within the semiconductor die 20. The copper vias 30 may be formed with a conventional process, such as etching via holes into the surface of the semiconductor die 20, coating the surface of the semiconductor die 20 with TiW, coating the TiW surface with copper, using an electroplating process to fill the via holes with copper, and then polishing the TiW and Cu off the surface of the semiconductor die 20. Alternatively, the vias may be formed by depositing W instead of Cu into the via holes (over the coating of TiW).

Also similar to the embodiment shown in FIG. 1, the semiconductor die 20 of FIG. 12 is electrically and physically attached to a multi-layered solder resist PCB 40. The PCB 40 contains multiple layers of electrical traces that properly direct electrical signals within the PCB. In addition, the PCB 40 contains leads 50 that electrically connect the circuitry of the PCB 40 and the semiconductor die 20 to other electrical devices (not shown) within an electrical system.

In accordance with the alternative embodiment shown in FIG. 12, the semiconductor die 20 is attached to the pads 35 of the PCB 40 through a layer of TiW 60, a copper pillar 70, and solder resist 80. Molding compound 90 encapsulates the semiconductor die 20 and portions of the PCB 40.

The copper pillar 70 in the alternative embodiment is pure copper throughout (therefore, there is no bottom portion 75 that includes interdiffused zinc). The use of both positive tone photoresist and negative tone photoresist during the fabrication process 300 (described more fully below) may prevent the formation of a layer of Zn at the interface between the layer of TiW 60 and the copper pillar 70.

As shown in FIG. 12, it is within the scope of the invention to create a layer of TiW and a copper pillar 70 that has a perimeter 100 that extends beyond the location of vias 30. This extended perimeter of elements 60, 70 may increase the likelihood that the entire surface of each via 30 is in electrical contact with elements 60, 70 (which may improve the reliability of the packaged semiconductor device 10).

FIG. 13 shows an alternative method 300 for fabricating the packaged semiconductor device 10 of FIG. 12. FIGS. 14-24 illustrate selected steps of method 300. The example method 300 is exemplary but not restrictive of alternative ways of implementing the principles of the invention.

Figure 14:
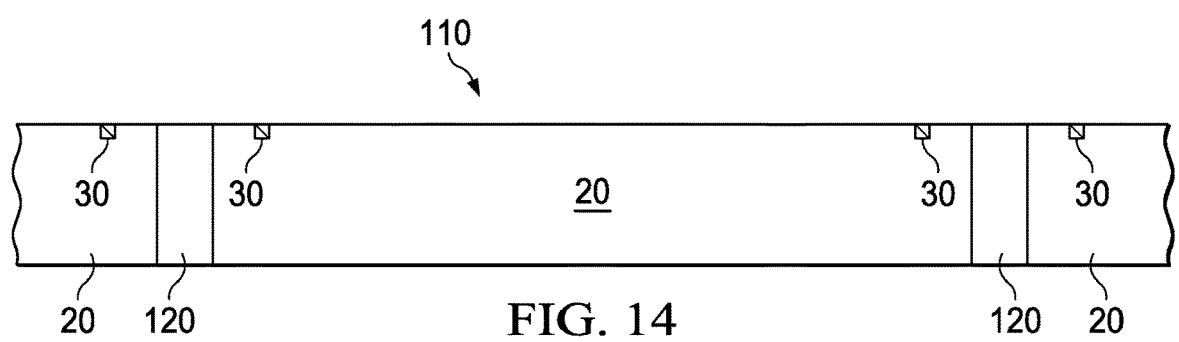
FIGS. 14-24 are cross-sectional diagrams of selected steps of the alternative method of FIG. 13.

Step 310 is the provision of a fully processed semiconductor wafer 110, as shown in FIG. 14. The semiconductor wafer 110 contains numerous completed semiconductor dies 20. The semiconductor dies may contain any combination of active and passive electrical circuitry (not shown), such as CMOS, BiCMOS and bipolar junction transistors—as well as capacitors, optoelectronic devices, inductors, resistors, and diodes. In addition, the semiconductor dies 20 include vias 30 that are connected to the electrical circuitry within the semiconductor die 20. In method 300 the vias include copper; however, the vias may contain other suitable materials such as tungsten.

The semiconductor dies 20 are spaced apart from each other on the semiconductor wafer 110 by zones 120 of unprocessed semiconductor material. These zones 120 of unprocessed semiconductor material are mostly destroyed by a rotating saw blade during the singulation process.

Figure 15:
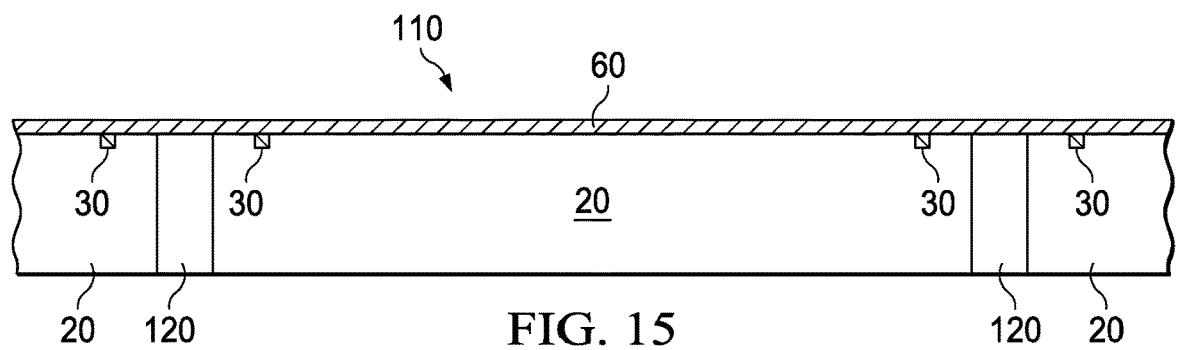

The next step in the fabrication process is the formation of a layer of TiW 60 over the semiconductor wafer 110. As shown in FIG. 15, a layer of TiW is coated over the semiconductor wafer in step 320. In the example method 300, the layer of TiW 60 is formed by sputtering; however, any acceptable method of deposition may be used. The thickness of the layer of TiW 60 may range from 100-400 nm. It is within the scope of the invention to use other acceptable materials that are a diffusion barrier and adhesion promoter. For example, a layer of Ti or TaN may be used instead of TiW 60.

Figure 16:
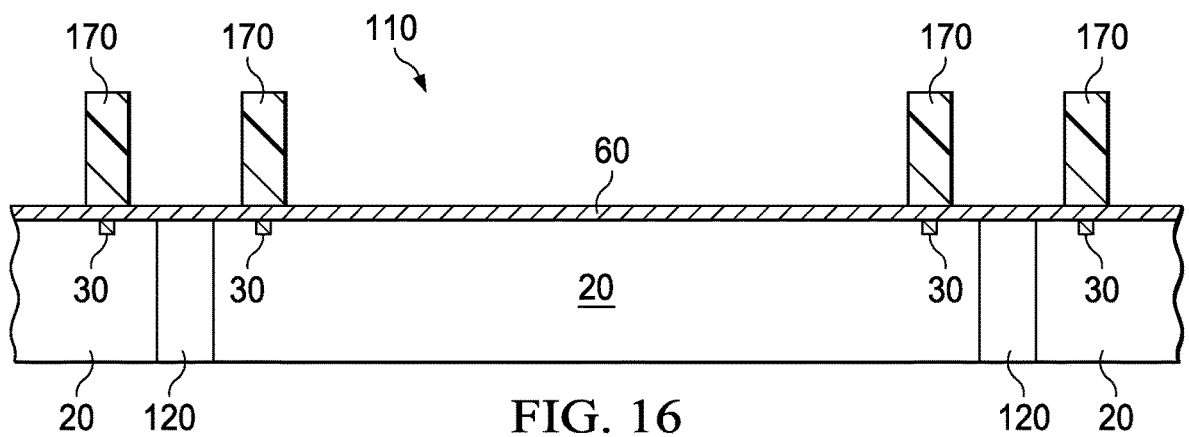

In accordance with the alternative method 300, step 330 is the formation of a first patterned photoresist 170 over the vias 30. As shown in FIG. 16, negative tone photoresist 170 is formed over the vias 30 of the semiconductor wafer 110. As known in the art, negative tone photoresist 170 becomes crosslinked (polymerized) when exposed to light. Therefore, negative tone photoresist 170 more difficult to dissolve in photoresist developer.

Figure 17:
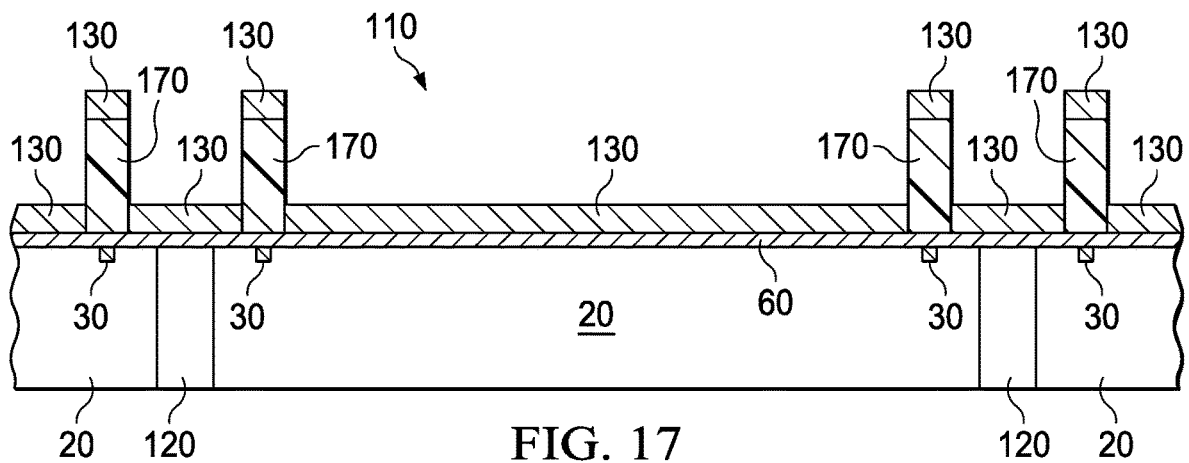
Figure 18:
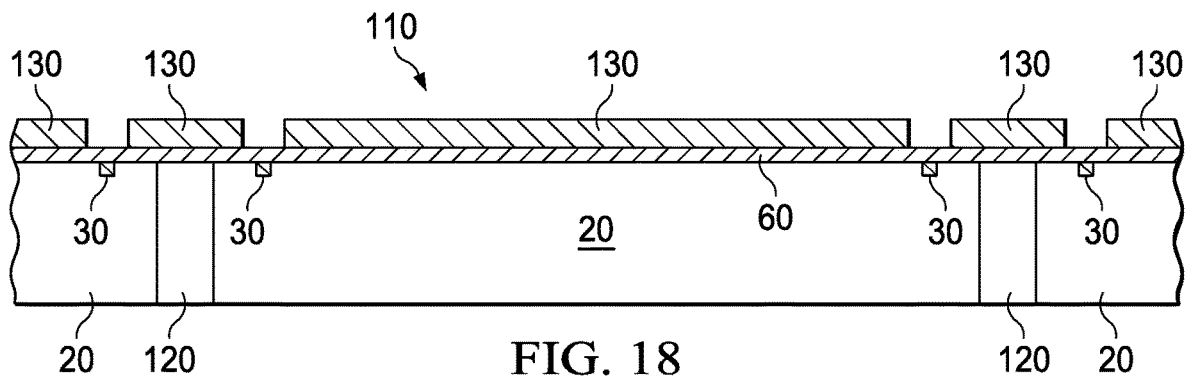

In step 335, shown in FIG. 17, the semiconductor wafer 110 is coated with a layer of Zn 130. The thickness of the layer of Zn 130 may range from 100 nm-20 µm. The layer of Zn 130 is sputtered over the layer of TiW 60 in step 335; however, another acceptable coating method may be used (such as electroplating). As shown in FIG. 18, step 340 is the removal of the first patterned photoresist 170 (using solvent or a plasma etch).

Figure 19:
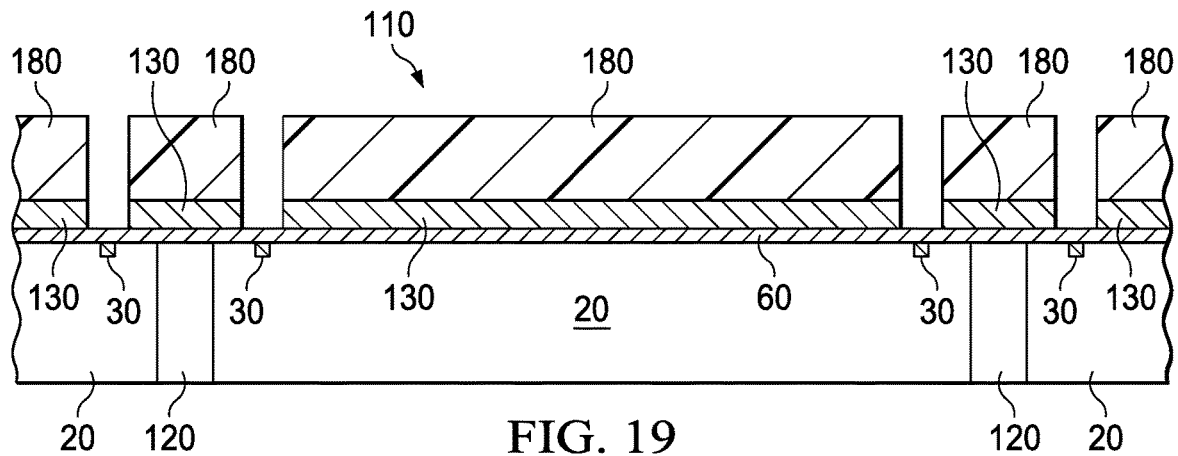

The next step 350, shown in FIG. 19, is the formation of a second patterned photoresist 180 over the layer of Zn 130. In accordance with the alternative method 300, the second patterned photoresist 180 is positive tone photoresist. As known in the art, the portion of positive tone photoresist that is exposed to light becomes soluble to the photoresist developer. (The unexposed portion of the positive tone photoresist remains insoluble to the photoresist developer). Therefore, a single mask (reticle) can be used for steps 330 and 350, which may reduce the cost of manufacturing the packaged semiconductor device 10.

Figure 20:
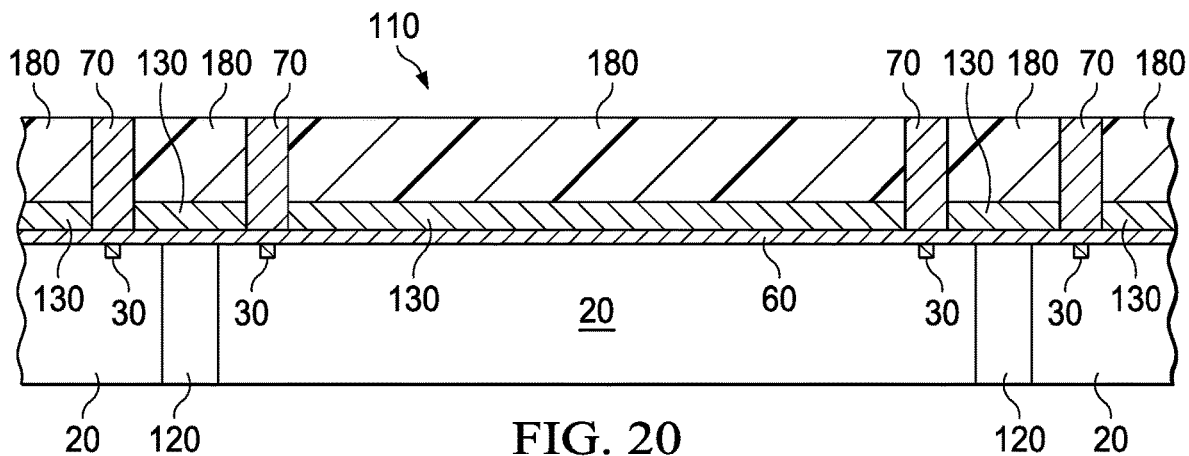
Figure 21:
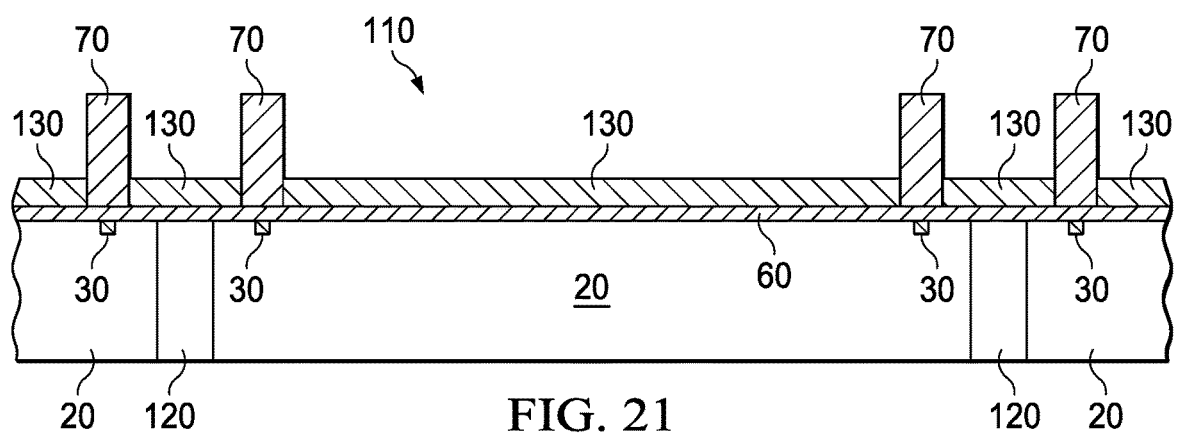

Step 355 is the formation of copper pillars 70. As shown in FIG. 20, the copper pillars 70 are formed over vias 30. More specifically, the copper pillars 70 are formed on the exposed layers of TiW 60 by a standard electroplating process and then the patterned photoresist 140 is removed (using solvent or a plasma etch) in step 360, as shown in FIG. 21.

Figure 22:
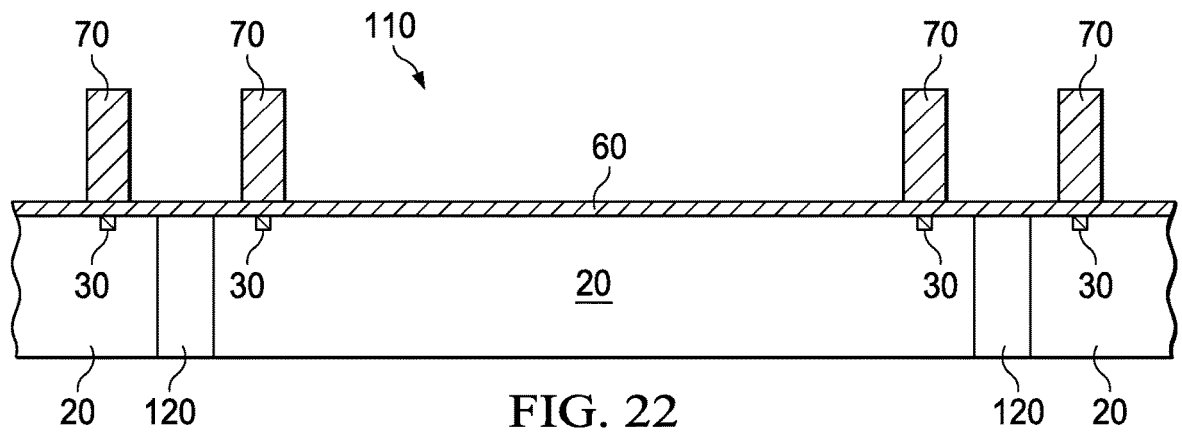

The next step 365 in the alternative method 300 is the removal of the layer of Zn 130, as shown in FIG. 22. The layer of Zn 130 may be removed by any acceptable process such as a wet etch using diluted hydrochloric add. Because the layer of Zn 130 is in contact with the copper pillar 70, the layer of Zn 130 will act as a cathodic protection component. As a result, the copper pillar 70 will not dissolve before the complete dissolution of the layer of Zn 130. Therefore, the layer of Zn 130 is a sacrificial layer that may prevent any corrosion of the copper pillar 70. Moreover, the use of the layer of Zn 130 instead of the copper seed layer that is currently used during the fabrication of copper pillars 70 results in minimal undercutting below the outer corners of the copper pillar 70 during the wet etch of the layer of Zn 130.

Figure 23:
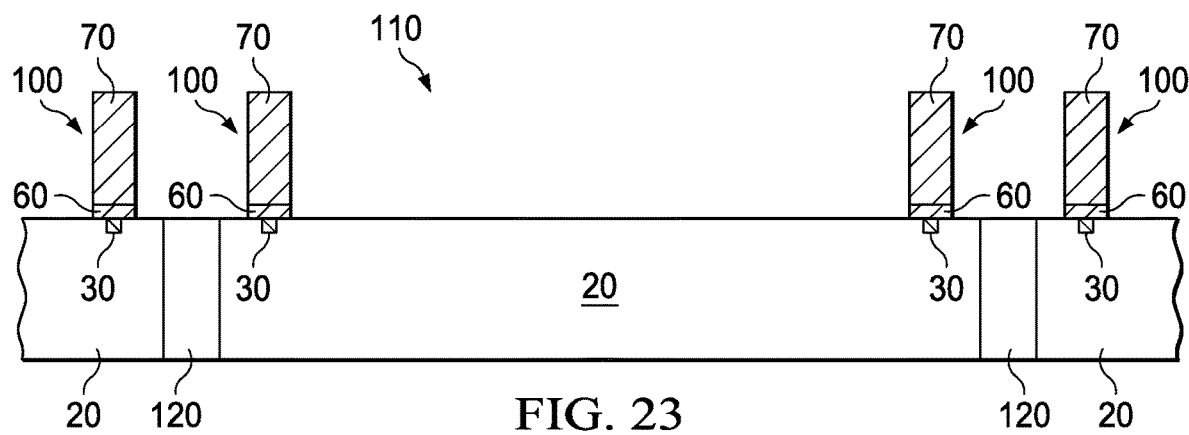

As shown in FIG. 23, the layer 60 of TiW located outside the perimeter 100 of the copper pillars 70 is removed in step 370 by any acceptable process such as a wet etch using hydrogen peroxide. It is to be noted that there may be a slight amount of undercutting (less than 3%) under the outer corners of the copper pillar 70 during the wet etch of the layer of TiW 60.

Figure 24:
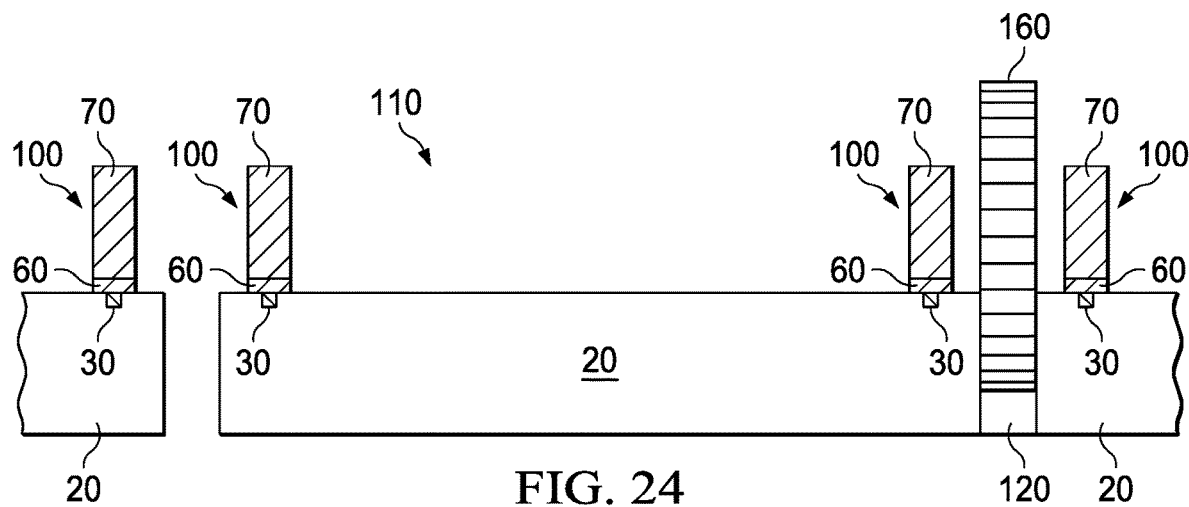

The semiconductor wafer 110 is singulated in step 380, as shown in FIG. 24. A rotating saw blade 160 is typically used to cut through the saw street zones 120 during the dicing process. This singulation process creates individual semiconductor dies 20 that can be further fabricated into a packaged semiconductor die 10 using conventional manufacturing steps. The individual semiconductor dies 20 may be connected to the PCB 40 using any acceptable conventional manufacturing process. In the example step 390, solder resist 80 (such as SnAg) is placed on the exposed top portion of the copper pillar 70 and then a robotic pick-and-place machine may be used to attach the copper pillars 70 to the pads 35 of the PCB 40. Later, the semiconductor die 20 and portions of the PCB 40 are encapsulated with molding compound to create the packaged semiconductor device 10, as shown in FIG. 12.

Various additional modifications to the invention as described above are within the scope of the claimed invention. As an example, it may be desirable to clean the semiconductor wafer 110 after the copper leads 30 have been exposed in while patterning the photoresist layer 140. The wafer clean may be used to remove any copper oxide that may have formed on the copper leads 30 before the sputtering the copper pillars 70. Similarly, it may be desirable to clean the semiconductor wafer 110 following the etching steps 270, 280 to remove any unwanted debris created by those etching processes.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for fabricating a copper pillar over a semiconductor wafer, comprising:
    providing said semiconductor wafer including a via;
    forming a layer of titanium tungsten (TiW) over said semiconductor wafer;
    forming a layer of zinc (Zn) in direct contact with said layer of TiW;
    forming a patterned photoresist over said layer of Zn, said patterned photoresist being absent over said via;
    forming said copper pillar over said via, said copper pillar having a perimeter;
    removing said patterned photoresist;
    performing an anneal;
    removing said layer of Zn; and
    removing said layer of TiW that is located outside said perimeter of said copper pillar.

2. The method of claim 1 wherein said via includes copper.

3. The method of claim 1 wherein said anneal causes interdiffusion of said layer of Zn and said copper pillar.

4. A method for fabricating a packaged semiconductor device, comprising:
    providing a semiconductor wafer including a via;
    forming a layer of titanium tungsten (TiW) over said semiconductor wafer;

forming a layer of zinc (Zn) in direct contact with said layer of TiW;
forming a patterned photoresist over said layer of Zn, said patterned photoresist being absent over said via;
forming a copper pillar over said via, said copper pillar having a perimeter;
removing said patterned photoresist;
performing an anneal;
removing said layer of Zn;
removing said layer of TiW that is located outside said perimeter of said copper pillar;
singulating said semiconductor wafer to form a semiconductor die;
attaching said copper pillar to a printed circuit board; and
covering said semiconductor die and portions of said printed circuit board with molding compound to form said packaged semiconductor die.

5. The method of claim 4 wherein said via includes copper.

6. The method of claim 4 wherein said anneal causes interdiffusion of said layer of Zn and said copper pillar.

7. A method for fabricating a copper pillar over a semiconductor wafer, comprising:
providing said semiconductor wafer including a via;
forming a layer of titanium tungsten (TiW) over said semiconductor wafer;
forming a first patterned photoresist over said via;
forming a layer of zinc (Zn) over said layer of TiW and said first patterned photoresist;
removing said first patterned photoresist;
forming a second patterned photoresist over said layer of Zn;
forming said copper pillar over said via, said copper pillar having a perimeter;
removing said second patterned photoresist;
removing said layer of Zn; and
removing said layer of TiW that is located outside said perimeter of said copper pillar.

8. The method of claim 7 wherein said via includes copper.

9. The method of claim 7 wherein said first patterned photoresist is negative tone photoresist.

10. The method of claim 7 wherein said second patterned photoresist is positive tone photoresist.

11. A method for fabricating a packaged semiconductor device, comprising:
providing a semiconductor wafer including a via;
forming a layer of titanium tungsten (TiW) over said semiconductor wafer;
forming a first patterned photoresist over said via;
forming a layer of zinc (Zn) over said layer of TiW and said first patterned photoresist;
removing said first patterned photoresist;
forming a second patterned photoresist over said layer of Zn;
forming a copper pillar over said via, said copper pillar having a perimeter;
removing said second patterned photoresist;
removing said layer of Zn;
removing said layer of TiW that is located outside said perimeter of said copper pillar;
singulating said semiconductor wafer to form a semiconductor die;
attaching said copper pillar to a printed circuit board; and
encapsulating said semiconductor die and portions of said printed circuit board with molding compound to form said packaged semiconductor device.

12. The method of claim 11 wherein said via includes copper.

13. The method of claim 11 wherein said first patterned photoresist is negative tone photoresist.

14. The method of claim 11 wherein said second patterned photoresist is positive tone photoresist.

* * * * *